(12) United States Patent
Kojo

(10) Patent No.: US 9,831,414 B2
(45) Date of Patent: Nov. 28, 2017

(54) SURFACE MOUNTED PIEZOELECTRIC VIBRATOR

(71) Applicant: Daishinku Corporation, Hyogo (JP)

(72) Inventor: Takuya Kojo, Hyogo (JP)

(73) Assignee: Daishinku Corporation, Hyogo (JP)

( * ) Notice: Subject to any disclaimer, the term of this patent is extended or adjusted under 35 U.S.C. 154(b) by 438 days.

(21) Appl. No.: 14/406,317

(22) PCT Filed: Mar. 27, 2013

(86) PCT No.: PCT/JP2013/002095
§ 371 (c)(1),
(2) Date: Dec. 8, 2014

(87) PCT Pub. No.: WO2013/190749
PCT Pub. Date: Dec. 27, 2013

(65) Prior Publication Data
US 2015/0162521 A1    Jun. 11, 2015

(30) Foreign Application Priority Data

Jun. 19, 2012  (JP) .................................. 2012-137447

(51) Int. Cl.
*H01L 41/053* (2006.01)
*H03B 5/36* (2006.01)
(Continued)

(52) U.S. Cl.
CPC ........ *H01L 41/053* (2013.01); *H01L 41/0475* (2013.01); *H03B 5/364* (2013.01);
(Continued)

(58) Field of Classification Search
CPC ... H01L 41/053; H01L 41/0475; H03B 5/364; H03H 9/0547; H03H 9/0561; H03H 9/17; H03H 9/171
(Continued)

(56) References Cited

U.S. PATENT DOCUMENTS 6,229,249 B1 * 5/2001 Hatanaka ................. H03B 5/04
310/348
8,278,801 B2 * 10/2012 Matsumoto .......... H03H 9/0514
310/344
(Continued)

FOREIGN PATENT DOCUMENTS

JP    2000-151283    5/2000
JP    2001-291742   10/2001
(Continued)

*Primary Examiner* — Bryan Gordon
(74) *Attorney, Agent, or Firm* — Norris McLaughlin & Marcus, P.A.

(57) ABSTRACT

A piezoelectric vibrator according to the invention has a base, an integrated circuit element, and a piezoelectric vibration element. The base has internal terminal pads, and external terminals including an AC output terminal. The base includes rectangular ceramic substrate layers stacked in at least three layers, each of which has castellations formed at four corners. Among the internal terminal pads, internal terminal pads for the integrated circuit element and internal terminal pads for the piezoelectric vibration element are connected to each other by externally exposed wiring patterns formed on upper surfaces of the castellations at the corners of the ceramic substrate constituting a middle layer.

8 Claims, 5 Drawing Sheets

(51) Int. Cl.
*H03H 9/05* (2006.01)
*H01L 41/047* (2006.01)
*H03H 9/17* (2006.01)
*H03H 9/10* (2006.01)
*H01L 23/00* (2006.01)

(52) U.S. Cl.
CPC ........ *H03H 9/0547* (2013.01); *H03H 9/0552* (2013.01); *H03H 9/0561* (2013.01); *H03H 9/1021* (2013.01); *H03H 9/17* (2013.01); *H03H 9/171* (2013.01); *H01L 24/13* (2013.01); *H01L 24/16* (2013.01); *H01L 24/48* (2013.01); *H01L 24/81* (2013.01); *H01L 24/85* (2013.01); *H01L 2224/13144* (2013.01); *H01L 2224/16225* (2013.01); *H01L 2224/16227* (2013.01); *H01L 2224/48227* (2013.01); *H01L 2224/81207* (2013.01); *H01L 2924/00014* (2013.01); *H01L 2924/12042* (2013.01); *H01L 2924/3025* (2013.01)

(58) Field of Classification Search
USPC ................... 310/365, 366, 367, 368
See application file for complete search history.

(56) References Cited

U.S. PATENT DOCUMENTS

| | | | | |
|---|---|---|---|---|
| 8,279,610 | B2* | 10/2012 | Iizuka | H01L 23/053 361/734 |
| 2002/0036448 | A1 | 3/2002 | Kageyama et al. | |
| 2002/0036546 | A1 | 3/2002 | Hatanaka et al. | |
| 2004/0113708 | A1* | 6/2004 | Takanashi | H03H 9/0547 331/158 |
| 2005/0055814 | A1* | 3/2005 | Hatanaka | H01L 24/97 29/25.35 |
| 2005/0184626 | A1* | 8/2005 | Chiba | H03H 9/1021 310/348 |
| 2005/0212387 | A1* | 9/2005 | Sasagawa | H03H 9/1021 310/348 |
| 2007/0120617 | A1 | 5/2007 | Sato et al. | |
| 2008/0266003 | A1* | 10/2008 | Yamashita | H03B 5/32 331/68 |
| 2012/0139391 | A1* | 6/2012 | Mizusawa | H03H 3/04 310/344 |
| 2012/0229223 | A1* | 9/2012 | Il | H03H 3/02 331/155 |

FOREIGN PATENT DOCUMENTS

| | | |
|---|---|---|
| JP | 2002-100932 | 4/2002 |
| JP | 2002-176318 | 6/2002 |
| JP | 2003-133857 | 5/2003 |
| JP | 2005-198227 | 7/2005 |
| JP | 2006-101276 | 4/2006 |
| JP | 2007-235544 | 9/2007 |

* cited by examiner

PRIOR ART

SURFACE MOUNTED PIEZOELECTRIC VIBRATOR

BACKGROUND OF THE INVENTION

The invention relates to surface mounted piezoelectric vibrators structurally characterized in that a package is constructed of a base having an opening on its upper-surface side and a housing portion formed in its interior, and a cover that seals the opening, and a piezoelectric vibration element and an integrated circuit element are housed in the housing portion of the base (hereinafter, simply referred to as "piezoelectric vibrator"). The invention more particularly relates to improvements in such package constructions of the piezoelectric vibrators.

Very accurate vibratory frequencies can be constantly obtained with the piezoelectric vibrators in which piezoelectric vibration elements, for example, crystal pieces, are used. Such piezoelectric vibrators are, therefore, conventionally employed in diverse fields as reference frequency sources for electronic devices. The piezoelectric vibrators typically have a structure in which an integrated circuit element is housed in a housing portion of a base with insulating properties having an opening on its upper-surface side, a piezoelectric vibration element is securely supported in the upper direction of the integrated circuit element, and a cover is provided to hermetically seal the piezoelectric vibration element. One can simplify the structure of such a piezoelectric vibrator with a relatively small number of components by customizing a one-chip integrated circuit element in which an inverter amplifier, for example, CMOS, is provided as a vibration amplifier, contributing to cost reduction. In recent years, flip-chip bonding is often employed in such piezoelectric vibrators because this bonding technique, in contrast to wire bonding, reduces the piezoelectric vibrators in size and height. An example is disclosed in JP2001-291742A, wherein pads of an integrated circuit element are flip-chip bonded, by means of metallic bumps made of such a material as gold, to internal terminal pads in the housing portion of a ceramic base by supersonic thermocompression bonding.

FIG. 10 illustrates the circuit configuration of a piezoelectric vibrator to be housed in the base.

In the drawing, 100 is an integrated circuit element, and 200 is a piezoelectric vibration element.

The integrated circuit element 100 includes, for example, inverter amplifiers AMP1 and AMP2, a feedback resistor Rf, a limiting resistor Rd, and capacitors C1 and C2. Referring to the other reference symbols, P1 to P3 are signal input and output units of the integrated circuit element 100, and P4 and P5 are signal input and output units of the piezoelectric vibration element 200. An alternating current signal or high frequency signal i1 is outputted from the output unit P3 of the integrated circuit element 100. An alternating current signal i2 flows between the input and output units P5 and P4 of the piezoelectric vibration element 200 and the input and output units P1 and P2 of the integrated circuit element 100. The integrated circuit element and the piezoelectric vibration element are thus connected in the circuit and housed in the base. In the base, the input and output units P1 to P5 for the signals i1 and i2 are connected by means of the pads of the integrated circuit element, internal terminal pads of the base, pads of the piezoelectric vibration element, and wiring patterns.

SUMMARY OF THE INVENTION

When such a piezoelectric vibrator is miniaturized, its operation is easily adversely affected by unwanted radiation (hereinafter, called radiation noise) generated by alternating current signals and/or high frequency signals flowing from the internal terminal pad for output of the base connected to the output pad of the integrated circuit element (which corresponds to the signal output unit P3 illustrated in FIG. 10) to the wiring patterns for output (signal output units of the integrated circuit element).

The piezoelectric vibrator undergoes the occurrence of phase differences and potential differences due to different waveforms between signals flowing through the signal output units of the integrated circuit element and signals flowing through the internal terminals pad for input which connect the signal input and output units of the piezoelectric vibration element and also flowing through the wiring patterns which connect these pads (connecting portions of the piezoelectric vibration element) although these signals have the same frequency. These phase and current differences may prompt interactions between the integrated circuit element signals and the piezoelectric vibration element signals, possibly resulting in operational problems. Conventionally, the piezoelectric vibration element signals at the connecting portions for the piezoelectric vibration element are sine wave signals, whereas the integrated circuit element signals at the output units of the integrated circuit element are rectangular wave signals. Therefore, the integrated circuit element signals include high frequency components that generate radiation noise as well as principal vibrations. As the frequency of the piezoelectric vibrator becomes higher, the high frequency noise components are more easily radiated as electromagnetic waves. The electromagnetic wave thus radiated may adversely affect the piezoelectric vibration element signals which are vibration sources.

The invention has an object to provide a piezoelectric vibrator hardly adversely affected by radiation noise even when miniaturized and achieving remarkable electric characteristics and high operational reliability.

To accomplish the object, the invention provides, according to a first aspect thereof, a piezoelectric vibrator, comprising:

a base with insulating properties, having a rectangular outer shape in plan view, the base including a plurality of ceramic substrate layers stacked in at least three layers and castellations extending in vertical directions and respectively formed at four corners of the rectangular shapes of the plurality of ceramic substrate layers, the base further including a housing portion having a plurality of internal terminal pads formed therein, and an exterior portion having at least four external terminals formed on an outer bottom surface thereof.

an integrated circuit element electrically connected to a part of the plurality of internal terminal pads; and a piezoelectric vibration element electrically connected to another part of the plurality of internal terminal pads and further electrically connected to the integrated circuit element, wherein the at least four external terminals are formed proximate to and in non-contact with the castellations formed at the four corners, and one of the at least four external terminals constitutes an external terminal for output of alternating current, the part and the another part of the plurality of internal terminal pads are formed on respective surfaces of the ceramic substrate layers which are different layers (hereinafter, different layer surfaces), externally exposed wiring patterns that provide connection between the part of the plurality of internal terminal pads and the another part of the plurality of internal terminal pads are formed on upper surfaces of first and second castellations alone, the first and second castellations being provided at one of pairs of corners among the four corners of the rectangular shape of the ceramic substrate layer constituting a middle layer between the ceramic substrate layers respectively constituting uppermost and lowermost layers of the ceramic substrate layers stacked in at least three layers, the first castellation is a castellation located opposite to a third castellation in a long-side direction of the base, the third castellation being provided at one of the four corners of the rectangular shape proximate to the external terminal for output of alternating current, and the second castellation is a castellation provided at one of the four corners diagonally opposite to the third castellation on the rectangular shape of the base in plan view.

As to a part of the wiring patterns that provide connection between first pads and second pads respectively for use with the integrated circuit element and the piezoelectric vibration element, the two different layer surfaces are connected only by the externally exposed wiring patterns formed on the upper surfaces at a pair of corners on the middle ceramic substrate layer. According to the invention providing such a technical feature, of conductive paths (wiring patterns) connecting the first pads and second pads respectively for use with the integrated circuit element and the piezoelectric vibration element, a conductive path connecting the two different layer surfaces can be located away from the external terminal for AC output.

At the time of occurrence of radiation noise due to alternating current and/or high frequency signals flowing in the external terminal for AC output, the externally exposed wiring patterns constituting the conductive paths that connect the different layer surfaces of the ceramic substrate layers, because of a larger portion of their areas facing a radiation noise source than the other wiring patterns, are more easily and greatly influenced by adverse impacts resulting from the radiation noise. According to the invention, wherein the externally exposed wiring patterns are located at positions distant from the external terminal for AC output, can minimize such adverse impacts caused by the radiation noise.

The piezoelectric vibrators increasingly miniaturized are subject to more restrictions regarding positions at which the external terminals, wiring patterns, and internal terminal pads are formed, and the externally exposed wiring patterns are more closely located to the external terminal for AC output and thereby more easily adversely affected. The invention can minimize such adverse impacts due to the radiation noise without discouraging the miniaturization of surface mounted piezoelectric vibrators.

The externally exposed wiring patterns may also be used as external measurement terminals that measure characteristics of the piezoelectric vibration element. This obviates the need for additional castellations on long and short sides of the base in order for the external measurement terminals to be provided. If additional castellations are formed on long and short sides of the base, particularly in the piezoelectric vibrators reduced in dimensions, the already existing issues become more pronounced; narrower space of the base housing, undermined strength of the base, and difficulty in securing an area to be sealed by a cover. The invention makes it unnecessary to address these issues, and leads to more accurate measurements because the measurements can be performed in the piezoelectric vibrators finalized as a product.

The four external terminals are formed proximate to and in non-contact with the castellations at the four corners on the outer bottom surface of the base, and the externally exposed wiring patterns are formed on the upper surfaces of the castellations, which are formed at a pair of corners on the middle ceramic substrate layer, alone. This prevents the occurrence of unfavorable events, for example, a solder used to join the piezoelectric vibrator to a circuit substrate progresses upward along the castellations of the base, or a metal-based sealing material used to join the cover to a sealing area of the base runs downward along the castellations of the base, thereby consequently avoiding the risk of short circuits between the external terminals and the external measurement terminals, and between the sealing material used to join the cover and the external measurement terminals.

According to a second aspect of the invention, in addition to the technical features described above, the piezoelectric vibrator is preferably characterized in that the piezoelectric vibration element mounted in the housing portion of the base is hermetically sealed with a cover attached to a joint area on an upper surface of the ceramic substrate layer constituting the uppermost layer and formed as a rectangular frame surrounding a rectangular space centrally located, the castellations of the ceramic substrate layer constituting the uppermost layer are formed at only four corners on an outer side of the rectangular frame of the ceramic substrate layer constituting the uppermost layer, and a chamfer or a curvature is formed at each of four corners on an inner side of the rectangular frame of the ceramic substrate layer constituting the uppermost layer.

The castellations of the uppermost ceramic substrate layer are formed at only four corners on the outer side of the frame, and the chamfers or curvatures are formed at four corners on the inner side of the frame proximate to these castellations. This technical feature, in addition to the advantageous effect described above, allows further miniaturization of the piezoelectric vibrator without narrowing the joint area for the cover, while improving the strength of the base at the same time.

According to a third aspect of the invention, in addition to the technical features described above, the piezoelectric vibrator is preferably characterized in that the integrated circuit element has a rectangular shape and includes pads formed on a main surface thereof, the pads being flip-chip bonded to the part of the plurality of internal terminal pads by means of bumps, the pads of the integrated circuit element include:

two opposing first pads formed proximate to a first side of the integrated circuit element;

two opposing second pads formed proximate to a second side opposite to the first side of the integrated circuit element; and two opposing third pads respectively formed between the first pads and the second pads, one of the two opposing second pads outputting alternating current, the plurality of internal terminal pads of the base include:

two opposing first internal terminal pads electrically connected to the piezoelectric vibration element and joined to the two opposing first pads of the integrated circuit element;

two opposing second internal terminal pads joined to the two opposing second pads; and two opposing third internal terminal pads joined to the two opposing third pads and interposed between the two opposing first internal terminal pads and the two opposing second internal terminal pads, the two opposing third internal terminal pads and two wiring patterns that respectively extend the two opposing third internal terminal pads are formed on the same surface along a part of perimeter of the two opposing first internal terminal pads to respectively form conducive paths for blocking radiation noise, and the two opposing first internal terminal pads and the two opposing second internal terminal pads are spaced apart with the conducive paths for blocking radiation noise interposed therebetween.

In addition to the advantageous effects described above, by thus forming the third internal terminal pads and the wiring patterns that respectively extend the third internal terminal pads on the same surface along a part of perimeter of the first internal terminal pads, the first internal terminal pads electrically connected to the piezoelectric vibration element can be isolated from the second internal terminal pads, in one of which is the AC output is included, by the third internal terminal pads and the associated wiring patterns formed on the same surface. By virtue of this structural advantage, any radiation noise generated by high frequency signals and/or alternating current flowing through one of the second internal terminal pads is blocked by the conductive paths formed by the third internal terminal pads and the wiring patterns that respectively extend the third internal terminal pads. The radiation noise, most of which is thus blocked, hardly arrives at the first internal terminal pads formed on the same surface and connected to the piezoelectric vibration element easily adversely affected by the noise. This successfully prevents unwanted radiation (radiation noise) generated by the AC output of the second internal terminal pad from adversely affecting the piezoelectric vibration element electrically connected to the first internal terminal pads.

Conventionally, the piezoelectric vibrators undergo the occurrence of phase differences and potential differences due to different signal waveforms between signals flowing through the AC output in one of the second internal terminal pads and signals flowing through the first internal terminal pads connected to the piezoelectric vibration element although these signals have the same frequency. These phase and current differences may prompt interactions between the AC output of the second internal terminal pad and the first internal terminal pads, possibly resulting in operational problems. On the other hand, the invention controls any operational problems caused by such interactions because the first internal terminal pads electrically connected to the piezoelectric vibration element are shut off from the second internal terminal pads in one of which the AC output is included by the conductive paths formed by the third internal terminal pads and the wiring patterns that respectively extend the third internal terminal pads on the same plane.

According to a fourth aspect of the invention, in addition to the technical features described above, the piezoelectric vibrator is preferably characterized in that the piezoelectric vibration element is an AT-cut crystal piece.

According to a fifth aspect of the invention, in addition to the technical features described above, the piezoelectric vibrator is preferably characterized in that the base includes a bottom portion constituting a lowermost layer, a first bank portion constituting a middle layer, and a second bank portion constituting an uppermost layer, the bottom portion constituting the lowermost layer is constructed of a single plate made of a ceramic material and having a rectangular shape in plan view, the first bank portion constituting the middle layer is made of a ceramic material and formed in a frame shape in plan view on the bottom portion constituting the lowermost layer, the second bank portion constituting the uppermost layer is made of a ceramic material and formed in a frame shape in plan view on the first bank portion constituting the middle layer, the housing portion of the base corresponding to the lowermost layer includes a first housing portion formed by the first bank portion constituting the middle layer to house therein the integrated circuit element, and a second housing portion formed by the second bank portion constituting the uppermost layer to house therein the piezoelectric vibration element, and the plurality of internal terminal pads are formed on an inner bottom surface of the first housing portion.

According to a sixth aspect of the invention, in addition to the technical features described above, the piezoelectric vibrator is preferably characterized in that the base includes an intermediate plate portion constituting a middle layer, a third bank portion constituting an upper layer, and a fourth bank portion constituting a lower layer, the intermediate plate portion constituting the middle layer is constructed of a single plate made of a ceramic material and having a rectangular shape in plan view, the third bank portion constituting the upper layer is made of a ceramic material and formed on the intermediate plate portion constituting the middle layer, the fourth bank portion constituting the lower layer is made of a ceramic material and formed in a frame shape in plan view below the intermediate plate portion constituting the middle layer, the housing portion of the base includes a third housing portion formed by the third bank portion constituting the upper layer to house therein the piezoelectric vibration element, and a fourth housing portion formed by the fourth bank portion constituting the lower layer to house therein the integrated circuit element, and the first to third internal terminal pads are formed on an inner bottom surface of the fourth housing portion.

According to a seventh aspect of the invention, in addition to the technical features described above, the piezoelectric vibrator preferably further comprises two first wiring patterns that respectively extend the two opposing first internal terminal pads to first and second castellations of the four castellations provided at the four corners of the rectangular shape of the base, two second wiring patterns that respectively extend the two opposing second internal terminal pads to remaining two castellations of the four castellations located opposite to the first and second castellations, and two wiring patterns for noise blocking extending in a short-side direction of the base from the two wiring patterns that respectively extend the two opposing third internal terminal pads to an end part of an inner bottom surface of the base.

According to an eighth aspect of the invention, in addition to the technical features described above, the piezoelectric vibrator is preferably characterized in that the castellations of the ceramic substrate layer constituting the middle layer are recessed more inward than at least one of the castellations of the ceramic substrate layers respectively constituting the uppermost layer and the lowermost layer.

As described so far, the invention provides a piezoelectric vibrator hardly adversely affected by radiation noise even when miniaturized and achieving remarkable electric characteristics and high operational reliability.

DETAILED DESCRIPTION OF THE INVENTION

Figure 1:
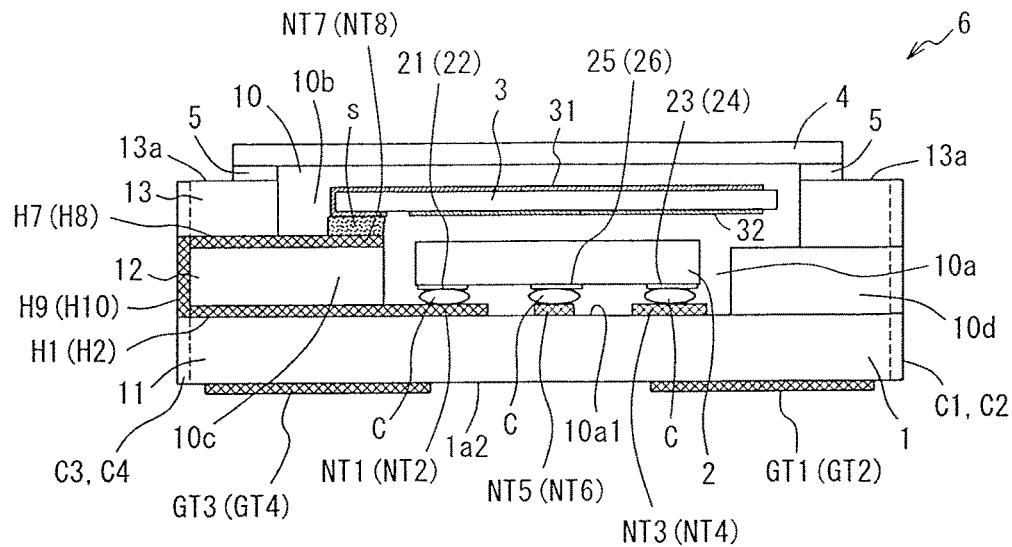
FIG. 1 is a sectional view representing a first example of the invention.
Figure 2:
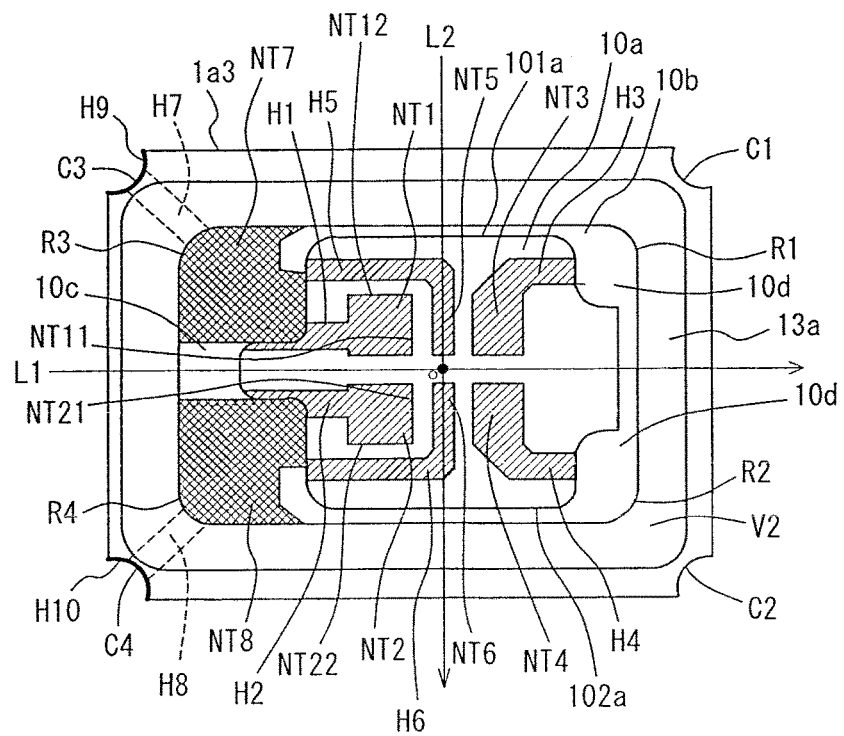
FIG. 2 is a plan view of a base not yet mounted with an integrated circuit element and a piezoelectric vibration element illustrated in FIG. 1 of the first example.
Figure 3:
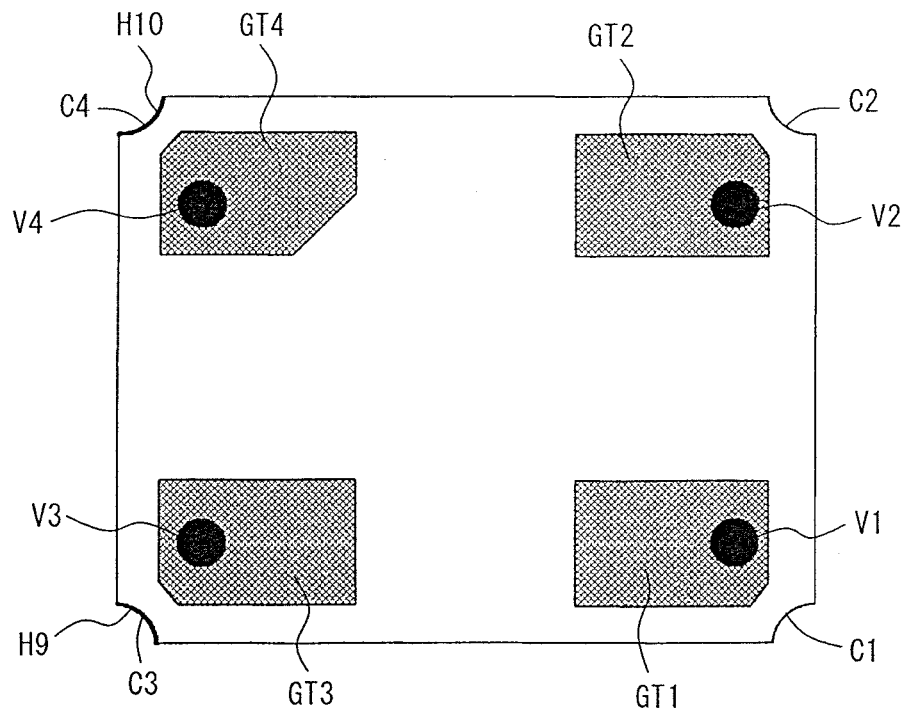
FIG. 3 is a bottom view of the base illustrated in FIG. 1 of the first example.
Figure 4:
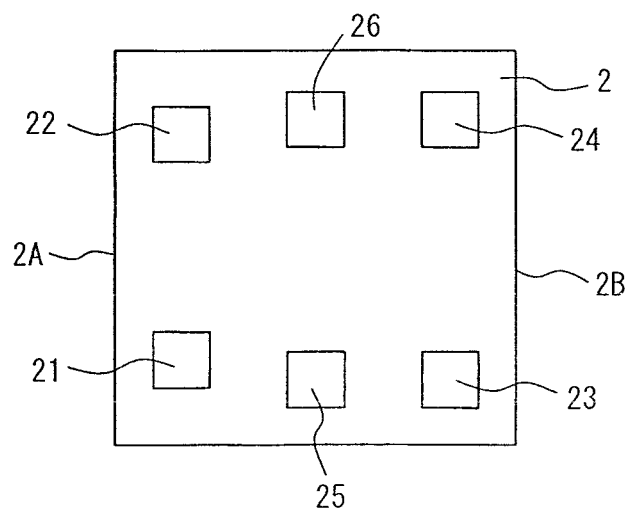
FIG. 4 is a bottom view of an integrated circuit element to which the invention is applied.
Figure 5:
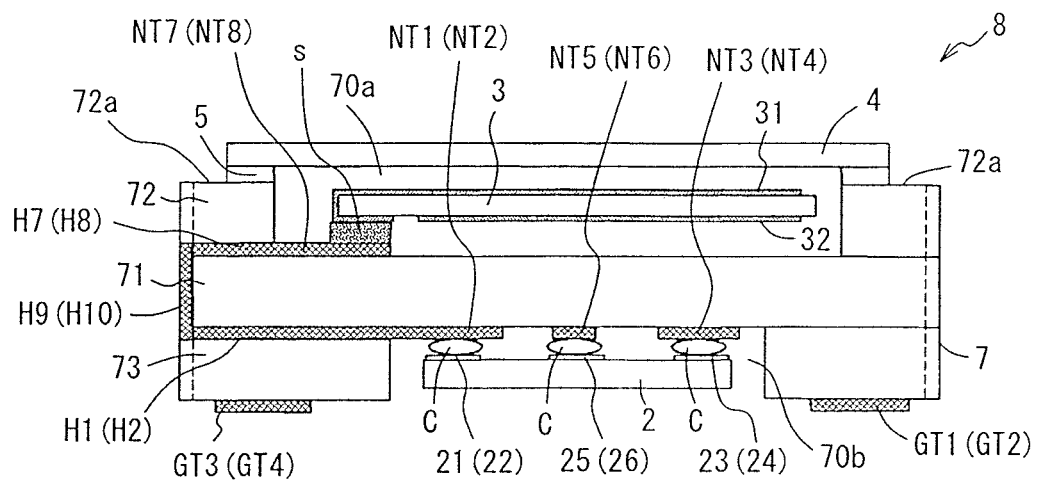
FIG. 5 is a sectional view representing a second example of the invention.
Figure 6:
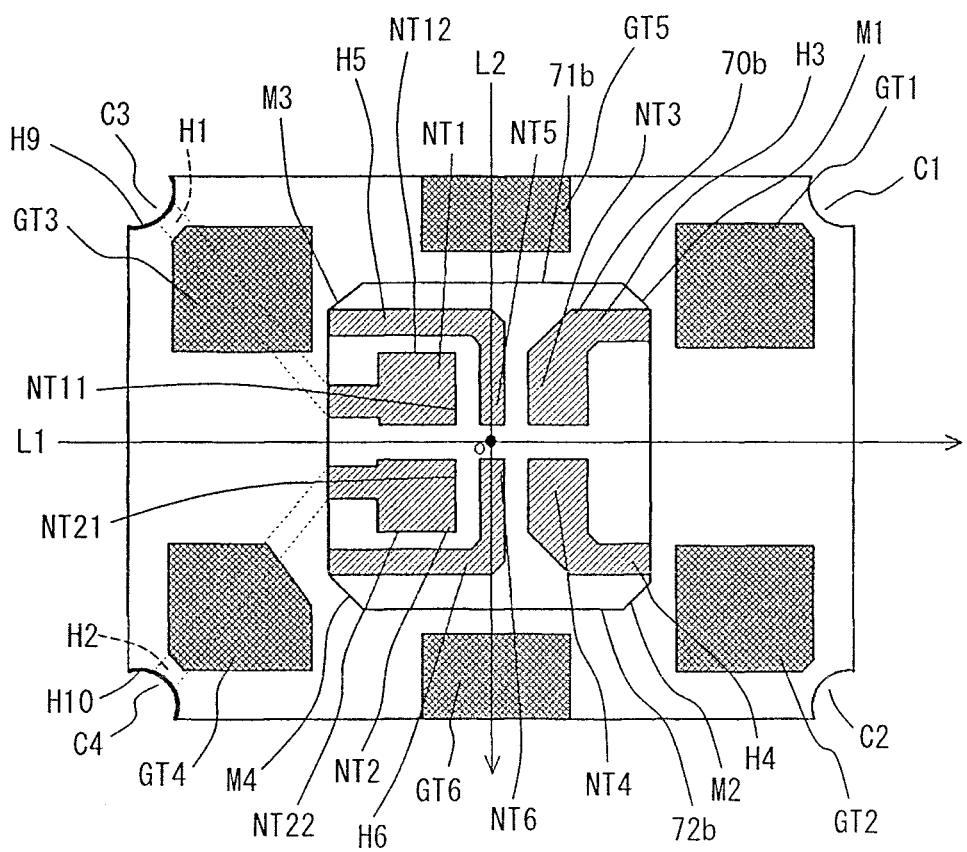
FIG. 6 is a bottom view of a base not yet mounted with an integrated circuit element illustrated in FIG. 5 of the second example.
Figure 7:
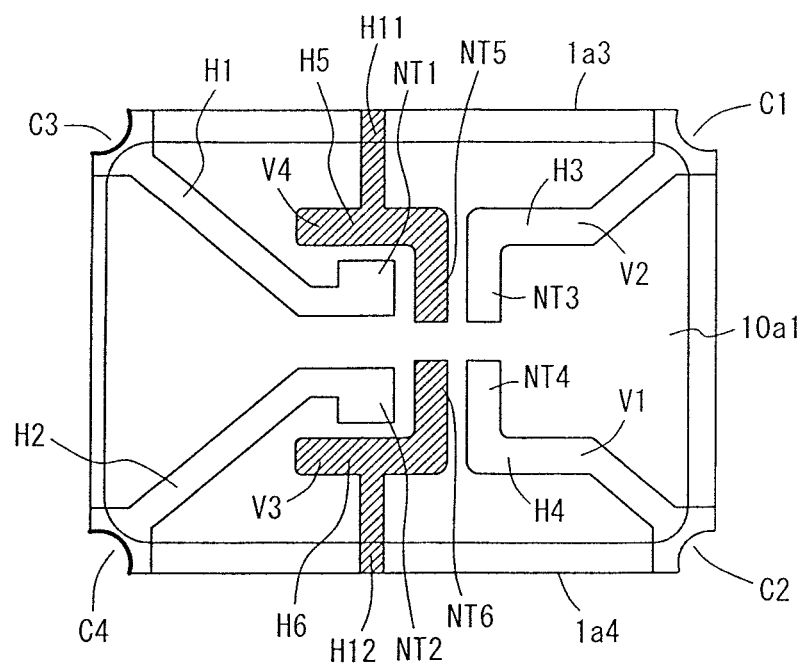
FIG. 7, representing a third example of the invention, is a plan view of a base not yet mounted with an integrated circuit element and a piezoelectric vibration element.
Figure 8:
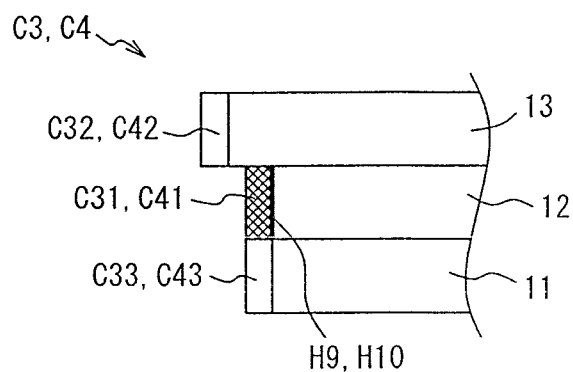
FIG. 8, representing a fourth example of the invention, is a sectional view of castellations of a base according to a modified example.
Figure 9:
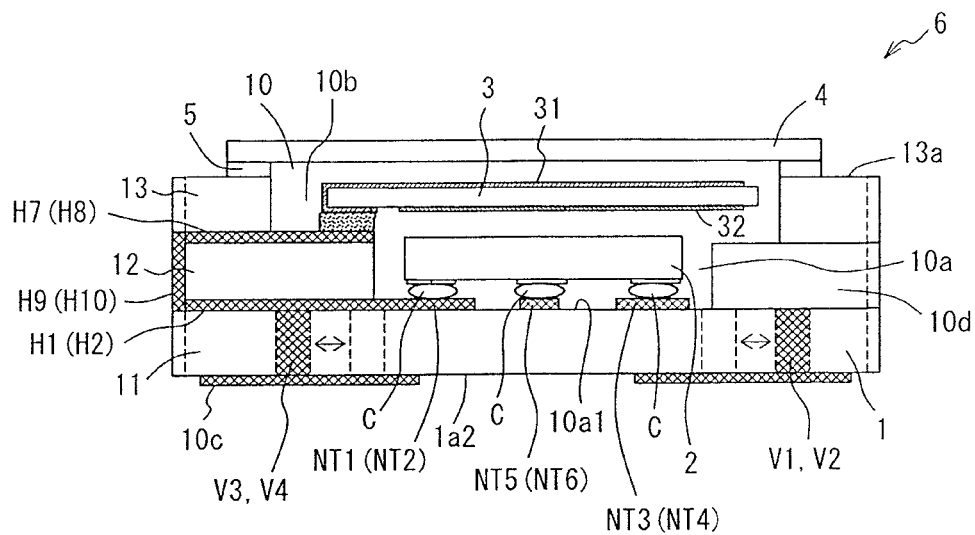
FIG. 9, is a sectional view representing a fifth example of the invention.
Figure 10:
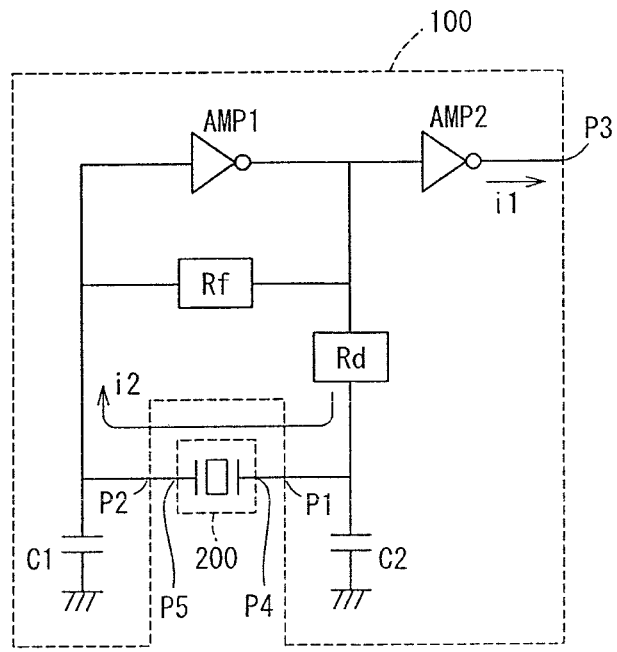
FIG. 10 is a circuit diagram of a piezoelectric vibrator.

Hereinafter, examples of a piezoelectric vibrator according to the invention are described referring to the accompanying drawings. FIGS. 1 to 3 are drawings of a first example of the invention. FIG. 4 is a bottom view of an integrated circuit element to which the invention is applied. FIGS. 5 and 6 are drawings of a second example of the invention. FIG. 7 is a drawing of a third example of the invention. FIG. 8 is a drawing of a fourth example of the invention. FIG. 9 is a drawing of a fifth example of the invention. In these examples, the same reference symbols are consistently used for any common or corresponding structural elements. In these examples, a crystal vibrator is used as a piezoelectric vibrator.

The first example is described referring to FIGS. 1 to 4

A crystal vibrator 6 includes a base 1 having a recessed portion, an integrated circuit element 2 housed in a lower section of the recessed portion of the base 1, a piezoelectric vibration element 3 housed in an upper section of the recessed portion of the base 1, and a cover 4 joined to an opening of the base 1. The package of the crystal vibrator 6 is constructed of the base 1 and the cover 4. The base 1 and the cover 4 are joined to each other by means of a sealing material 5. The piezoelectric vibration element 3 includes, for example, an AT-cut crystal piece. The interior of the base 1 is hermetically sealed with the sealing material 5 joined thereto.

The base 1 of the crystal vibrator 6 has an opening on its upper-surface side alone. The integrated circuit element 2 is mounted on an inner bottom surface 10a1 of the base 1 and housed in the base. The piezoelectric vibration element 3 is housed in an upper section of the base 7. The crystal vibrator 6 has a laminated structure in which the integrated circuit element 2 and the piezoelectric vibration element 3 are vertically situated.

The base 1 has a laminated substrate in which three ceramic substrate layers are stacked on one another, and its overall shape is rectangular parallelepiped. The base 1 has a bottom portion 1 constituting a lowermost layer, a bank portion 12 constituting a middle layer, and a bank portion 13 constituting an uppermost layer. The bottom portion 11 is constructed of a single plate having a rectangular shape in plan view and made of an insulating ceramic material such as alumina. The bank portions 12 and 13 are made of an insulating ceramic material such as alumina and formed in a frame shape in plan view.

By thus providing these structural elements, the base 1 is formed in a box shape having a recessed housing portion 10 when viewed in cross section. The bank portion 13 has a flattened upper surface. The bank portions 12 and 13 constitute a side wall of the base 1. The upper surface of the bank portion 13 constitutes an upper end surface of the base 1. The housing portion 10 has a rectangular shape in plan view and includes a first housing portion 10a on the lower side and a second housing portion 10b on the upper side. The integrated circuit element 2 is housed in the first housing portion 10a, and the piezoelectric vibration element 3 is housed in the second housing portion 10b. At four corners on the inner side of the frame shape of the bank portion 13 are formed curvature portions R1, R2, R3, and R4. The base 1 has a three-layered structure including the bottom portion 11 and the bank portions 12 and 13. The base 1, however, may consist of a single layer, two layers, or four layers depending on desirable shapes of the housing portion 10 formed in the base 1.

The upper surface of the bank portion 13 of the base 1 is used as a joint area 13a to be joined to the cover 4. More specifically, the joint area 10a includes three metallic layers; a metalized layer made of a metalizing material such as tungsten or molybdenum, a nickel layer formed on the metalized layer, and a gold layer formed on the nickel layer, wherein tungsten or molybdenum is subjected to integral molding during firing of the ceramic material, which employs metalizing assisted with thick film printing. The nickel layer and the gold layer are formed on the metalized layer by plating in the mentioned order.

At four corners of the outer peripheral wall of the base 1 rectangular in plan view are formed a plurality of castellations (dent) C1, C2, C3, and C4 vertically extending. These castellations are obtained by vertically forming arc-shaped cutouts in the outer peripheral wall of the base 1. The joint area 13a is electrically led out to an external terminal pad GT2 formed on an outer bottom surface 1a2 of the base 1 through at least one of a conductive via V2 vertically through-connecting the bank portions 12 and 13 of the base 1, and a wiring pattern, not illustrated in the drawings, formed in an upper part of the castellation C2. When the external terminal pad GT2 is ground-connected, the metallic cover 4 is grounded through the joint area 13a, conductive via, and wiring pattern in the upper part of the castellation, in consequence of which the electromagnetic shielding effect of the crystal vibrator 6 can be obtained.

In the base 1, the bank portion 12 forms the first housing portion 10a substantially rectangular in plan view for housing therein the integrated circuit element 2. Referring to the drawings, inner side surfaces on the right and left sides of the bank portion 12 are protruding more inward than the bank portion 13. The protrusion on the left side of the bank portion 12 serves as a holding table 10c for holding one end part of the piezoelectric vibration element 3. The protrusion on the right side of the bank portion 12 serves as a pillow portion 10d located opposite to the holding table 10c with the first housing portion 10a interposed therebetween. In the upper direction of the first housing portion 10a is provided the second housing portion 10b formed by the bank portion 13. Further, pairs of pads arranged vertically on the drawing are juxtaposed laterally on the inner bottom surface 10a1 of the first housing portion 10a (inner bottom surface of the base 1). The paired internal terminal pads are, respectively, first internal terminal pads NT1 and NT2, second internal terminal pads NT3 and NT4, and third internal terminal pads NT5 and NT6. The first housing portion 10a has a substantially rectangular shape in plan view with two specific sides 101a and 102a extending in parallel with the direction in which these pads are juxtaposed.

On the upper surface of the lowermost bottom portion 11 of the base 11, that is the inner bottom surface 10a1 of the first housing portion 10a, there are a plurality of rectangular internal terminal pads NT (NT1 to NT6) connected to the pads of the integrated circuit element 2, and wiring patterns H (H1 to H6 described later) which extend these internal terminal pads. These internal terminal pads and wiring patterns are arranged in juxtaposition. As illustrated in FIG. 2, of the internal terminal pads NT, the paired first internal terminal pads NT1 and NT2, respectively for AC input and AC output, are electrically connected to signal input and output pads of the piezoelectric vibration element 3 not illustrated in the drawings, and the internal terminal pads NT1 and NT2 are also connected to a pair of first pads 21 and 22 of the integrated circuit element 2. One of the first pads 21 and 22 of the integrated circuit element 2 is connected to the signal input pad of the piezoelectric vibration element 3 through one of the first internal terminal pads NT1 and NT2. The other one of the first pads 21 and 22 is connected to the signal output pad of the piezoelectric vibration element 3 through the other one of the first internal terminal pads NT1 and NT2. The paired second internal terminal pads NT3 and NT4, respectively for output of AC signals from the integrated circuit element 2 and for grounding the integrated circuit element 2, are connected to a pair of second pads 23 and 24 of the integrated circuit element 2. According to the first example, the second pad 23 of the integrated circuit element 2 is a pad through which AC signals are outputted from the integrated circuit element 2. The AC signals are then outputted to the second internal terminal pad NT3. The paired third internal terminal pads NT5 and NT6 are pads to which a direct current potential is applied. These pads NT5 and NT6 are connected to a pair of third pads 25 and 26 of the integrated circuit element 2. The source of the direct current potential or ground potential applied to these pads is the integrated circuit element 2. Of the wiring patterns H, the first wiring patterns H1 and H2 respectively extend the first internal terminal pads NT1 and NT2, the second wiring patterns H3 and H4 respectively extend the second internal terminal pads NT3 and NT4, and the third wiring patterns H5 and H6 respectively extend the third internal terminal pads NT5 and NT6. Instead of applying the direct current potential alone to the paired third internal terminal pads NT5 and NT6, the ground potential may be applied to these third internal terminal pads.

As illustrated in FIG. 2, the third internal terminal pad NT5 and the third wiring pattern H5 are formed along two sides (along a part of two sides) of the first internal terminal pad NT1. Further, the third internal terminal pad NT6 and the third wiring pattern H6 are formed along two sides (along a part of two sides) of the first internal terminal pad NT2. The third internal terminal pad NT5 and the third wiring pattern H5, and the third internal terminal pad NT6 and the third wiring pattern H6 respectively form conductive paths for blocking radiation noise. These conductive paths serve to block radiation noise occurred from the second pad 23 of the integrated circuit element 2 so that the radiation noise cannot arrive at the first internal terminal pad NT1 or NT2. The first internal terminal pads NT1 and NT2 and the second internal terminal pads NT3 and NT4 are spaced apart with the noise-blocking conductive paths interposed therebetween. The radiation noise occurred from the second pad 23 of the integrated circuit element 2 is prevented from arriving at the first internal terminal pads NT1 and NT2. The direct current potential from the integrated circuit element 2 is applied to the third internal terminal pads NT5 and NT6 to effectively block the radiation noise. The direct current potential is applied from the integrated circuit element 2. As described earlier, the ground potential may be applied instead of applying the direct current potential.

The first internal terminal pads NT1 and NT2 and the second internal terminal pads NT3 and NT4 are formed in larger widths than the third internal terminal pads NT5 and NT6 located between the first and second internal terminal pads in a direction in parallel with the specific sides 101a and 102a of the first housing portion 10a. The first internal terminal pads NT1 and NT2, second internal terminal pads NT3 and NT4, and third internal terminal pads NT5 and NT6 are respectively oppositely arranged to be substantially symmetric to a virtual line L1 in parallel with the specific sides 101a and 102a and passing through a center point O of the first housing portion 10a. The third internal terminal pads NT5 and NT6 are substantially oppositely arranged along a virtual line L2 orthogonal to the specific sides 101a and 102a passing through the center point O of the first housing portion 10a.

According to the first example, the third internal terminal pads NT5 and NT6 and the third wiring patterns H5 and H6 are formed in a substantially L shape and substantially symmetric to the virtual line L1 along respective two sides of the rectangular first internal terminal pads NT1 and NT2, which are sides NT11 and NT21 of the first internal terminal pads NT1 and NT2 nearest to the second internal terminal pads NT3 and NT4, and sides NT12 and NT22 of the first internal terminal pads NT1 and NT2 nearest to the bank portion 12 facing an external environment. The third internal terminal pad NT5 and the third wiring pattern H5 formed in a substantially L shape constitutes a first conductive path for blocking radiation noise surrounding the first internal terminal pad NT1. The third internal terminal pad NT6 and the third wiring pattern H6 formed in a substantially L shape constitute a second conductive path for blocking radiation noise surrounding the first internal terminal pad NT2. By thus providing the substantially L-shaped conductive paths for blocking radiation noise by the third internal terminal pads NT5 and NT6 and the third wiring patterns H5 and H6, the first internal terminal pads NT1 and NT2 are surely enclosed and shut off from the second internal terminal pads NT3 and NT4 by the conductive paths interposed therebetween without any unnecessary area increase of the first housing portion 10a.

On the lower surface of the bottom portion 11 of the base 11 (constituting a part of the exterior portion) are formed a plurality of external terminal pads GT to be connected to external components or external devices. Specifically, they are external terminal pads GT1, GT2, GT3, and GT4 as illustrated in FIG. 3. The external terminal pads GT1, GT2, GT3, and GT4 are formed proximate to and in non-contact with the castellations C1, C2, C3, and C4 at the four corners on the bottom surface of the base 1. Moreover, the external terminal pads GT1, GT2, GT3, and GT4 are electrically led out to any ones of the second internal terminal pads NT3 and NT4 and the third internal terminal pads NT5 and NT6 through conductive vias V1, V2, V3, and V4 vertically penetrating through the bottom portion 11 of the base 1 by way of the second wiring patterns H3 and H4 and the third wiring patterns H5 and H6. According to the invention, the second internal terminal pad NT3 and the second wiring pattern H3 are connected to the second pad 23 of the integrated circuit element 2 for AC output, and electrically led out to the external terminal pad GT1 formed on the bottom-surface side of the base through the conductive via V1 penetrating through the bottom portion 11 of the base, which ultimately provides as an external terminal for AC output.

The holding table 10c for mounting thereon the piezoelectric vibration element 3 is formed on the upper surface of the bank portion 12 constituting the middle layer of the base 1 (inner bottom surface of the second housing portion 10b). On the upper surface of the holding table 10c are formed fourth internal terminal pads NT7 and NT8 connected to driving electrodes of the piezoelectric vibration element 3, and fourth wiring patterns H7 and H8 that respectively extend the fourth internal terminal pads NT7 and NT8. More specifically, the fourth internal terminal pad NT7 connected to a driving electrode 31, which is one of driving electrodes of the piezoelectric vibration element 3, is extended by the fourth wiring pattern H7 to the castellation C3 at the corner of the bank portion 12. As to the fourth wiring pattern H7 extended to the castellation C3, the two different layer surfaces (upper surface of the lowermost bottom portion 11 and upper surface of the middle bank portion 12) are connected by only a part extended by the first wiring pattern H1 from the first internal terminal pad NT1 to the castellation C3 at the corner of the bottom portion 11, and an externally exposed wiring pattern H9 formed on the upper surface of the castellation C3 of the bank portion 12 not including the bank portion 13 and the bottom portion 11. The fourth internal terminal pad NT8 connected to a driving electrode 32, which is the other one of the driving electrodes of the piezoelectric vibration element 3, is extended by the fourth wiring pattern H8 to the castellation C4 at the corner of the bank portion 12. As to the fourth wiring pattern H8 extended to the castellation C4, the two different layer surfaces (upper surface of the lowermost bottom portion 11 and upper surface of the middle bank portion 12) are connected by only a part extended by the first wiring pattern H2 from the first internal terminal pad NT2 to the castellation C4 at the corner of the bottom portion 11, and an externally exposed wiring pattern H10 formed on the upper surface of the castellation C4 of the bank portion 12 constituting the middle layer not including the bank portion 13 and the bottom portion 11 respectively constituting the uppermost layer and the lowermost layer.

The base 1 thus structurally characterized is formed by a conventional ceramic laminating or metalizing technique. Similarly to the formation of the joint area 13a, the internal terminal pads, external terminal pads, and wiring patterns are formed by stacking layers, such as nickel and gold plating layers, on the upper surface of a metalized layer of tungsten or molybdenum.

The externally exposed wiring patterns H9 and H10 are respectively formed at the castellations C3 and C4 distant from the external terminal GT1 for AC output. The externally exposed wiring pattern H9 is formed at the castellation C3 located opposite to the castellation C1 on the base 1 in the long-side direction thereof, and the externally exposed wiring pattern H10 is formed at the castellation C4 located diagonally opposite to the castellation C1 on the base 1.

The integrated circuit element 2 is a one-chip integrated circuit element embedded with an inverter amplifier (vibration amplifier) such as C-MOS. The integrated circuit element 2 and the piezoelectric vibration element 3 constitute a vibrator circuit. As illustrated in FIG. 4, the integrated circuit element 2 has pads whose shapes are, for example, rectangular. These pads are two opposing first pads 21 and 22 formed near a first side 2A of the integrated circuit element, two opposing second pads 23 and 24 formed near a second side 2B opposite to the first side 2A, and two opposing third pads 25 and 26 formed between the first and second pads. The two first pads 21 and 22 are electrically connected to the driving electrodes 31 and 32 of the piezoelectric vibration element 3. One of the two second pads 23 and 24 is a pad for AC output. The plural pads 21 to 26 of the integrated circuit element 2 and the internal terminal pads NT1 to NT6 formed on the base 1 for use with the integrated circuit element 2 are electromechanically flip-chip bonded by supersonic thermocompression bonding by means of metallic bumps C made of, for example, gold.

The piezoelectric vibration element 3 is mounted in the upper direction of the integrated circuit element 2 in spaced relationship with the integrated circuit element 2. The piezoelectric vibration element 3 is, for example, a rectangular AT-cut crystal piece. On front and back surfaces of the piezoelectric vibration element 3 are oppositely formed a pair of rectangular driving electrodes 31 and 32 and extraction electrodes thereof. These electrodes are formed by layered thin films including, for example, a ground electrode layer made of chrome or nickel, a middle electrode layer made of silver or gold, and an upper electrode layer made of chrome or nickel, or layered thin films including, for example, a ground electrode layer made of chrome or nickel and an upper electrode layer made of silver or gold. These electrodes are formed by a thin film formation technique such as vacuum evaporation or sputtering.

The piezoelectric vibration element 3 is bonded to the base 1 with a pasty silicone-based conductive resin adhesive (conductive joining material) S containing metallic fine particles of, for example, a silver filler. As illustrated in FIG. 1, the conductive resin adhesive S is applied to the upper surfaces of the first internal terminal pad NT7 and the second internal terminal pad NT8. The conductive resin adhesive S is also applied to between the piezoelectric vibration element 3 and the holding table 10c and then cured to allow electromechanical bonding therebetween. The piezoelectric vibration element 3 is accordingly held one-sidedly with one end thereof being spaced from the inner bottom surface of the first housing portion 10a of the base 1 and the other opposite end thereof being joined to the holding table 10c.

The cover 4 for sealing the base 1 is a core member made of, for example, Kovar, in which a metallic brazing filler metal (sealing material) is formed. The sealing material 5 thus including the brazing filler metal is joined to the joint area (metallic film) 13a of the base 1. In plan view, the metallic cover 4 has an outer shape substantially equal to or slightly smaller than the outer shape of the ceramic base.

After the integrated circuit element 2 and the piezoelectric vibration element 3 are housed in the housing portion 10 of the base 1, the cover 4 is attached to the joint area 13a of the base 1, and the sealing material 5 of the cover 4 and the joint area 13a of the base are melted and then cured to hermetically seal the piezoelectric vibration element 3. As a result of these processes, production of the crystal vibrator 6 is completed.

Referring to FIGS. 5 and 6, a crystal vibrator 8 according to a second example of the invention has a base 7 having openings on its upper and lower sides, respectively forming recessed portions. The base 7 is an H-mounting base in which an integrated circuit element 2 is mounted on an inner bottom surface of the lower recessed portion and a piezoelectric vibration element 3 is mounted on an inner bottom surface of the upper recessed portion. Description of any components of these drawings similar to those described in the first example may be partly omitted.

The base 7 includes an intermediate plate portion 71, a bank portion 72, and a bank portion 73, and its overall shape is rectangular parallelepiped. The intermediate plate portion 71 constituting a middle layer is constructed of a single plate rectangular in plan view and made of an insulating ceramic material such as alumina. The bank portion 72 constituting an uppermost layer is made of a ceramic material and formed on the intermediate plate portion 71 in a frame shape in plan view (in the form of a rectangular frame surrounding a rectangular space centrally located). The bank portion 73 constituting a lowermost layer is made of a ceramic material and formed below the intermediate plate portion 71 in a frame shape in plan view (in the form of a rectangular frame surrounding a rectangular space centrally located). The base 7 has two housing portions on its upper and lower sides; first and second housing portions 70a and 70b. The base 7 is a box-shaped member having a substantially H shape when viewed in cross section. The bank portion (side wall portion) 72 is formed along perimeter of the housing portion 70a. The bank portion 72 has a flattened upper surface (end surface). The bank portion (side wall portion) 73 is formed along perimeter of the housing portion 70b. The bank portion 73 has a flattened lower surface (end surface). The piezoelectric vibration element 3 is housed in the housing portion 70a. The integrated circuit element 2 is housed in the lower housing portion 70b. At four corners on the inner side of the frame shapes of the bank portions 72 and 73 are formed chamfers M1, M2, M3, and M4 (chamfers of the bank portion 73 alone are illustrated in FIG. 6). The ceramic laminated substrate is not necessarily limited to the three-layer structure of this example, and may include four or more layers depending on desirable shapes of the housing portions formed in the base.

The flat upper surface (end surface) of the bank portion 72 constituting the uppermost layer of the base 1 is a joint area (metallic film) 72a to be joined to the cover 4. The joint area 72a includes a metalized layer made of a metalizing material such as tungsten or molybdenum, a nickel layer formed on the metalized layer, and a gold layer formed on the nickel layer, wherein tungsten or molybdenum is subjected to integral molding during firing of the ceramic material, which employs metalizing assisted with thick film printing. The nickel layer and the gold layer are formed on the metalized layer by plating in the mentioned order.

At four corners of the outer peripheral wall of the base 7 are formed a plurality of castellations C1, C2, C3, and C4 vertically extending. These castellations are obtained by vertically forming arc-shaped cutouts in the outer peripheral wall of the base. The joint area 72a is electrically led out to a part of an external terminal pad GT2 formed on the bottom-surface side of the base through at least one of a conductive via, not illustrated in the drawings, vertically through-connecting the bank portion 72 and the intermediate plate portion 71 of the base, and a wiring pattern, not illustrated in the drawings, formed in an upper part of the castellation C2. When the external terminal pad GT2 is ground-connected, the metallic cover is grounded through the joint area 72a, conductive via, and wiring pattern in the upper part of the castellation, in consequence of which the electromagnetic shielding effect of the surface mounted crystal vibrator can be obtained.

In the base 7, the second housing portion 70b substantially rectangular in plan view for housing therein the integrated circuit element 2 is formed on the lower surface by the bank portion (side wall portion) 73, and the first housing portion 70a substantially rectangular in plan view for housing therein the piezoelectric vibrator element 3 is formed on the upper surface by the bank portion (side wall portion) 72. The substantially rectangular shape of the second housing portion 70b includes two specific sides 71b and 72b in parallel with a direction in which first internal terminal pads NT1 and NT2, second internal terminal pads NT3 and NT4, and third internal terminal pads NT5 and NT6 are juxtaposed.

On the lower surface of the intermediate plate portion 71 constituting the middle layer of the base 7 (inner bottom surface of the second housing portion 70b), there are a plurality of rectangular internal terminal pads NT connected to the integrated circuit element 2, and wiring patterns H which extend these internal terminal pads. These internal terminal pads and wiring patterns are arranged in juxtaposition. More specifically, as illustrated in FIG. 6, the internal terminal pads NT formed on the lower surface of the intermediate plate portion 71 constituting the middle layer of the base 7 (inner bottom surface of the second housing portion 70b) are two opposing first internal terminal pads NT1 and NT2 electrically connected to the piezoelectric vibration element 3 and further connected to first pads 21 and 22 of the integrated circuit element 2, two opposing second internal terminal pads NT3 and NT4 connected to second pads 23 and 24 of the integrated circuit element 2, and two opposing third internal terminal pads NT5 and NT6 connected to third pads 25 and 26 of the integrated circuit element 2. The wiring patterns H formed on the lower surface of the intermediate plate portion 71 constituting the middle layer of the base 7 (inner bottom surface of the second housing portion 70b) are first wiring patterns H1 and H2 which respectively extend the first internal terminal pads NT1 and NT2, second wiring patterns H3 and H4 which respectively extend the second internal terminal pads NT3 and NT4, and third wiring patterns H5 and H6 which respectively extend the third internal terminal pads NT5 and NT6.

As illustrated in FIG. 6, the third internal terminal pad NT5 and the third wiring pattern H5 that extends the third internal terminal pad NT5 are formed along two sides (along a part of two sides) of the first internal terminal pad NT1. Further, the third internal terminal pad NT6 and the third wiring pattern H6 that extends the third internal terminal pad NT6 are formed along two sides (along a part of two sides) of the first internal terminal pad NT2. The first internal terminal pads NT1 and NT2 are accordingly isolated from the second internal terminal pads NT3 and NT4.

The first internal terminal pads NT1 and NT2 and the second internal terminal pads NT3 and NT4 are formed in larger widths than the third internal terminal pads NT5 and NT6 located between the first and second internal terminal pads in a direction in parallel with the specific sides 71b and 72b of the second housing portion 70b. The two first internal terminal pads NT1 and NT2, two second internal terminal pads NT3 and NT4, and two third internal terminal pads NT5 and NT6 are respectively oppositely arranged to be substantially symmetric to a virtual line L1 in parallel with the specific sides 71b and 72b passing through a center point O of the second housing portion 70b (housing portion for use with the integrated circuit element). Further, the two third internal terminal pads NT5 and NT6 are substantially oppositely arranged along a virtual line L2 orthogonal to the specific sides 71b and 72b passing through the center point O of the second housing portion 70b.

The third internal terminal pads NT5 and NT6 and the third wiring patterns H5 and 116 that extend the third internal terminal pads NT5 and NT6 are formed in a substantially L shape and substantially symmetric to the virtual line L1 along respective two sides of the rectangular first internal terminal pads NT1 and NT2, which are sides NT11 and NT21 of the first internal terminal pads NT1 and NT2 nearest to the second internal terminal pads NT3 and NT4 and sides NT12 and NT22 of the first internal terminal pads NT1 and NT2 nearest to the bank portion 73 facing an external environment. With the third internal terminal pads and the third wiring patterns thus combined, the first internal terminal pads NT1 and NT2 are surely enclosed and shut off from the second internal terminal pads NT3 and NT4 by the third wiring patterns H5 and H6 interposed therebetween without any unnecessary 6 area increase of the second housing portion 10b.

On the flattened lower surface of the bank portion 73 of the base 7 are formed a plurality of external terminal pads GT for mounting purpose to be connected to external components and external devices. More specifically, as illustrated in FIG. 6, external terminal pads GT1, GT2, GT3, and GT4 are formed proximate to and in non-contact with the castellations C1, C2, C3, and C4 at the four corners of the bottom surface of the base 7. In the long-side direction of the base, an external terminal pad GT5 is formed between the external terminal pad GT1 and the external terminal pad GT3, and an external terminal pad GT6 is formed between the external terminal pad GT2 and the external terminal pad GT4. The external terminal pads GT1 to GT4 are electrically led out to any ones of the second internal terminal pads NT3 and NT4 and the third internal terminal pads NT5 and NT6 through conductive vias penetrating through upward (not illustrated in the drawings) by way of the second wiring patterns H3 and H4 and the third wiring patterns H5 and H6. According to the invention, the second internal terminal pad NT3 and the second wiring pattern H3 are connected to the second pad 23 for AC output of the integrated circuit element 2, and electrically led out to the external terminal pad GT1 for mounting purpose formed on the bottom-surface side of the base through conductive vias (not illustrated in the drawings) vertically penetrating through the bank portion 73 of the base, which ultimately allows to serve as an external terminal for AC output.

On the upper surface of the intermediate plate portion 71 constituting the middle layer of the base 7 (bottom surface of the first housing portion 70a) are formed fourth internal terminal pads NT7 and NT8 (partly illustrated in the drawing) to be connected to driving electrodes of the piezoelectric vibration element 3, and fourth wiring patterns H7 and H8 that respectively extend the fourth internal terminal pads NT7 and NT8. More specifically, the fourth internal terminal pad NT7 connected to a driving electrode 31 of the piezoelectric vibration element 3 is extended by the fourth wiring pattern H7 to the castellation C3 at the corner of the intermediate plate portion 71. As to the fourth wiring pattern H7 extended to the castellation C3, the two different layer surfaces (upper and lower surfaces of the intermediate plate portion 71 constituting the middle layer) are connected by only a part extended by the first wiring pattern H1 from the first internal terminal pad NT1 to the castellation C3 at the corner of the intermediate plate portion 71, and an externally exposed wiring pattern H9 formed on the upper surface of the castellation C3 of the intermediate plate portion 71 constituting the middle layer not including the uppermost bank portion 72 and the lowermost bank portion 73. The fourth internal terminal pad NT8 connected to a driving electrode 32 of the piezoelectric vibration element 3 is extended by the fourth wiring pattern H8 to the castellation C4 at the corner of the intermediate plate portion 72 constituting the middle layer of the ceramic substrate. As to the fourth wiring pattern H8 extended to the castellation C4, the two different layer surfaces (upper and lower surfaces of the intermediate plate portion 71 constituting the middle layer) are connected by only a part extended by the first wiring pattern H2 from the first internal terminal pad NT2 to the castellation C4 at the corner of the intermediate plate portion 71, and an externally exposed wiring pattern H10 formed on the upper surface of the castellation C4 of the intermediate plate portion 71 constituting the middle layer not including the uppermost bank portion 72 and the lowermost bottom portion 73.

The base 7 thus structurally characterized is formed by a conventional ceramic laminating or metalizing technique. Similarly to the formation of the joint area 72a, the internal terminal pads, external terminal pads for mounting purpose, and wiring patterns are formed by stacking layers, such as nickel and gold plating layers, on the upper surface of a metalized layer of tungsten or molybdenum.

The externally exposed wiring patterns H9 and H10 are formed at the castellations C3 and C4 at a pair of corners distant from the external terminal GT1 for AC output. More specifically, the externally exposed wiring pattern H9 is formed at the castellation C3 located opposite to the castellation C1 near the corner near the external terminal GT1 for AC output on the base 1 in the long-side direction thereof, and the externally exposed wiring pattern H10 is formed at the castellation C4 located diagonally opposite to the castellation C1 at the corner near the external terminal GT1 for AC output on the base 1.

As illustrated in FIG. 5, the plural pads 21 to 26 of the integrated circuit element 2 and the internal terminal pads NT1 to NT6 formed on the base 7 are electromechanically flip-chip bonded by means of metallic bumps C made of, for example, gold by supersonic thermocompression bonding.

The piezoelectric vibration element 3 is bonded to the base 7 with a pasty silicone-based conductive resin adhesive (conductive joining material) S containing metallic fine particles of, for example, a silver filler. As illustrated in FIG. 5, the adhesive S is applied to the upper surfaces of the first internal terminal pad NT7 and the second internal terminal pad NT8. The adhesive S is also applied to between the piezoelectric vibration element 3 and the inner bottom surface of the first housing portion 70a of the base 7 and then cured to allow electromechanical bonding therebetween. The piezoelectric vibration element 3 is accordingly held one-sidedly with one end thereof being spaced from the inner bottom surface of the first housing portion 70a of the base 7 and the other opposite end thereof being joined to the inner bottom surface of the first housing portion 70a of the base 7.

The cover 4 for sealing the base 1 is a core member made of, for example, Kovar, in which a metallic brazing filler metal (sealing material) is formed. The sealing material 5 thus including the brazing filler metal is joined to the joint area (metallic film) 72a of the base 1. In plan view, the metallic cover has an outer shape substantially equal to or slightly smaller than the shape of the ceramic base.

After the integrated circuit element 2 is housed in the second housing portion 70b of the base 7 and the piezoelectric vibration element 3 is housed in the first housing portion 70a, the cover 4 is attached to the joint area 72a of the base 7, and the sealing material 5 of the cover 4 and the joint area 72a of the base are melted and then cured to hermetically seal the piezoelectric vibration element 3. As a result of these processes, production of the crystal vibrator 8 is completed.

As to the wiring patterns H1, H2, H7 and H8 that provide connection between the internal terminal pads NT1 and NT2 for use with the integrated circuit element and the internal terminal pads NT7 and NT8 for use with the piezoelectric vibration element, the two different layer surfaces are connected by only the externally exposed wiring patterns H9 and H10 formed on the upper surfaces of the castellations C3 and C4 at a pair of corners of the bank portion 12 or the intermediate plate portion 71. Therefore, of the conductive paths connecting the internal terminal pads NT1 and NT2 and the internal terminal pads NT7 and NT8 (wiring patterns H1, H2, H7, and H8, and externally exposed wiring patterns H9 and H10), the conductive paths connecting the two different layer surfaces (externally exposed wiring patterns H9 and H10) can be located at positions distant from the external terminal GT1 for AC output. This arrangement successfully minimizes adverse impacts provoked by radiation noise.

The examples described so far succeed in minimizing adverse impacts provoked by radiation noise without discouraging the miniaturization of the piezoelectric vibrators 6 and 8. The externally exposed wiring patterns H9 and H10 formed on the upper surfaces C3 and C4 can be further used as external measurement terminals to solely measure characteristics of the piezoelectric vibration element 3. This makes it unnecessary to additionally form castellations near the long or short side of the base in order to provide external measurement terminals, avoiding such risks as weakening the bases 1 and 7 in strength, and difficulty to secure the sealing area to be joined to the cover 4.

The four external terminal pads GT1, GT2, GT3, and GT4 are formed proximate to and in non-contact with the castellations C1, C2, C3, and C4 at the four corners of the bottom surface of the base, and the formation of the externally exposed wiring patterns H9 and H10 is limited to the bank portion 12 or the upper surfaces of the castellations C3 and C4 at a pair of corners of the intermediate plate portion 71. This prevents the occurrence of unfavorable events, for example, a solder used to join the piezoelectric vibrator 6 or 8 to a circuit substrate progresses upward along the castellations C3 and C4 of the base, or the sealing material 5 containing the brazing filler metal and used to join the cover 4 to the sealing area of the base runs downward along the castellations C3 and C4 of the base, thereby consequently avoiding the risk of short circuits between the external terminals and the external measurement terminals, and between the sealing material used to join the cover and the external measurement terminals.

The castellations C1, C2, C3, and C4 of the bank portion 13 or 72 are formed at only the four corners on the outer side of the frame, and the chamfers M1, M2, M3, and M4 or curvatures R1, R2, R3, and R4 are formed at the four corners on the inner side of the frame proximate to the castellations C1, C2, C3, and C4. Therefore, the piezoelectric vibrators 6 and 8 can be improved in strength and further miniaturized at the same time without narrowing the joint areas 13a and 72a to be joined to the cover 4.

By forming the third internal terminal pads NT5 and NT6 and the third wiring patterns H5 and H6 (partly) along two sides of the first internal terminal pads NT1 and NT2, the first internal terminal pads NT1 and NT2 electrically connected to the piezoelectric vibration element 3 and the second internal terminal pad NT3 for AC output can be spaced apart with the third internal terminal pads NT5 and NT6 and the third wiring patterns H5 and HG interposed therebetween. Because of this structural advantage, radiation noise, if generated by high frequency signals and/or alternating current flowing in the second internal terminal pad NT3, can be mostly blocked by the conductive paths formed by the third internal terminal pads NT5 and NT6 and the third wiring patterns H5 and H6, and hardly arrives at the first internal terminal pads NT1 and NT2 connected to the piezoelectric vibration element 3 more likely to be adversely affected by radiation noise. Thus, any adverse impacts of radiation noise generated by the AC output of the second the internal terminal pad NT3 are controlled not to affect the piezoelectric vibration element 3 electrically connected to the first internal terminal pads NT1 and NT2. Another particular advantage is to be able to suppress possible problems caused by interactions between the second internal terminal pad NT3 for AC output and the first internal terminal pads NT1 and NT2 electrically connected to the piezoelectric vibration element 3 because the first internal terminal pads NT1 and NT2 are shut off from the second internal terminal pad NT3 by the conductive paths formed by the third internal terminal pads NT5 and NT6 and the third wiring patterns H5 and H6.

When the internal terminal pads NT1 to NT6 of the bases 1 and 7 and the pads 21 to 26 of the integrated circuit element 2 are flip-chip bonded by means of the bumps C, any positional displacement of the bumps C relative to the pads and/or any positional displacement between the pads and the internal terminal pads is absorbed by the first and second internal terminal pads NT1, NT2, NT3, and NT4 formed in large widths. This prevents such an unfavorable event that the bumps run off the edges of the internal terminal pads NT1 to NT6 at the time of bonding. Because the first internal terminal pads NT1 and NT2 and the second internal terminal pads TN3 and TN4 are formed in larger widths than the third internal terminal pads NT5 and NT6, integrated circuit elements 2 of various types with slightly different plane areas and/or with pads somewhat differently located can be similarly mounted on the bases 1 and 7. This provides a diversified range of products and facilitates cost reduction. The piezoelectric vibrators 6 and 8 thus structurally characterized can be miniaturized by reducing distances between the first internal terminal pads NT1 and NT2 and the second and second internal terminal pads NT3 and NT4 without undermining the radiation noise blocking effect by the third internal terminal pads formed in smaller widths. The invention, while succeeding in miniaturizing the piezoelectric vibrators 6 and 8, can improve mountability in flip-chip bonding of the integrated circuit element 2, bonding reliability, and versatility.

Further, the first internal terminal pads NT1 and NT2, second internal terminal pads NT3 and NT4, and third internal terminal pads NT5 and NT6 are respectively oppositely arranged to be substantially symmetric to the virtual line L1 in parallel with the specific sides passing through the center point O of the housing portion in which the integrated circuit element is housed.

This structural advantage helps to equalize the variability of height dimensions of the respective pads when warped in a direction orthogonal to the specific sides of the housing portion in which the integrated circuit element is housed, more specifically, height dimensions of the paired first pads 21 and 22 and first internal terminal pads NT1 and NT2, paired second pads 23 and 24 and second internal terminal pads NT3 and NT4, and paired third pads 25 and 26 and third internal terminal pads NT5 and NT6. To flip-chip bond the internal terminal pads of the bases 1 and 7 and the pads of the integrated circuit element by means of bumps by supersonic thermocompression bonding, an equal pressing force can be dispersedly applied to pairs of bumps C respectively used in the paired first pads 21 and 22 and first internal terminal pads NT1 and NT2, paired second pads 23 and 24 and second internal terminal pads NT3 and NT4, and paired third pads 25 and 26 and third internal terminal pads NT5 and NT 6. This avoids the risk of strength variability. The two third internal terminal pads NT5 and NT6 are substantially oppositely arranged along the virtual line L2 orthogonal to the specific sides passing through the center point O of the housing portion in which the integrated circuit element is housed. To flip-chip bond the internal terminal pads NT1 to NT6 of the bases 1 and 7 and the pads 21 to 26 of the integrated circuit element 2 by means of the bumps C by supersonic thermocompression bonding, the center point of the integrated circuit element 2 can be located near an apex of warps in two directions (near the center point O according to the present example); a direction along the specific sides of the housing portion in which the integrated circuit element is housed, and a direction orthogonal to the direction. As a result, an equal pressing force and an equal compression strength are applied to the bumps C at six positions in total of the paired first pads 21 and 22 and first internal terminal pads NT1 and NT2, paired second pads 23 and 24 and second internal terminal pads NT3 and NT4, and paired third pads 25 and 26 and third internal terminal pads NT5 and NT6. This provides an increased bonding strength and a higher reliability. Thus, the invention, while succeeding in miniaturizing the piezoelectric vibrators 6 and 8, can stabilize the bonding strength of the bumps C in the flip-chip bonding of the integrated circuit element 2, thereby ensuring more reliable electromechanical bonding.

The AT-cut crystal piece is used as the piezoelectric vibration element in the examples described so far. However, the piezoelectric vibration element is not necessarily limited thereto but may be a crystal piece of tuning fork type. The material of the piezoelectric vibration element is crystal, however, is not necessarily limited thereto. The material may be arbitrarily selected from, for example, piezoelectric ceramics and piezoelectric monocrystal materials such as $LiNbO_3$. In place of holding the piezoelectric vibration element one-sidedly as described in the examples, both ends of the piezoelectric vibration element may be held. In place of the silicone-based conductive resin adhesive used in the examples, the conductive joining material may be selected from other conductive resin adhesives, and metallic materials and brazing filler metals used in metallic bumps and metal-plated bumps.

The invention is applied to the piezoelectric vibration element 3 and the integrated circuit element 2, however, is also applicable to other devices. It is arbitrarily decided how many piezoelectric vibration elements are used. The invention is applicable to piezoelectric vibrators mounted with, in addition to the integrated circuit element 2, other circuit components. For the electrical connection between the integrated circuit element and the base, flip-chip bonding by supersonic thermocompression bonding is not the only option, and other techniques such as wire bonding may be employed. In place of the vibrator circuit configured as a one-chip integrated circuit element embedded with an inverter amplifier, such as C-MOS, as its vibration amplifier, the vibrator circuit may be equipped with one selected from other vibration amplifiers.

Instead of using the metallic brazing filler metal, the sealing technique may be selected from, for example, seam welding, beam welding (for example, laser beam, electronic beam) or glass welding.

FIG. 7 is a drawing representing a third example of the invention. This drawing is a plan view transparently illustrating the bank portions 12 and 13 of the base 1 before the integrated circuit element 2 and the piezoelectric vibration element 2 are mounted thereon according to a third example of the invention. According to the third example, wiring patterns H11 and H12 for noise blocking are extending in the short-side direction of the base 1 from fifth and sixth wiring patterns H5 and H6 to end parts 1a3 and 1a4 of the inner bottom surface 10a1 of the base 1. The noise blocking wiring patterns H11 and H12 are located between first wiring patterns H1 and H2 and second wiring patterns H3 and H4 on both sides in the long-side direction of the base 1. The noise blocking wiring patterns H11 and H12 serve to prevent interferences between signals flowing in the first wiring patterns H1 and H2 extended to castellations C3 and C4 and signals flowing in the second wiring patterns H3 and H4 extended to the castellations C1 and C2.

FIG. 8 is a drawing representing a fourth example of the invention. According to the fourth example, of surfaces of the castellations C3 and C4, upper surfaces C31 and C41 corresponding to the middle bank portion 12 (upper surfaces of the middle layer) and upper surfaces C33 and C43 corresponding to the lowermost base 11 (upper surfaces of the uppermost layer) are formed more inward than upper surfaces C32 and C42 corresponding to the uppermost bank portion 13 (upper surfaces of the uppermost layer). This structural feature is aimed at protecting the externally exposed wiring patterns H9 and H10 during the transportation of the crystal vibrator by avoiding contacts between hands, fingers, and/or transporting tools and the externally exposed wiring patterns H9 and H10 formed on the upper surfaces C31 and C41. Though not illustrated in the drawings, the middle upper surfaces C31 and C41 of the castellations C3 and C4 corresponding to the middle bank portion 12 may be formed more inward than the upper surfaces C32 and C42 of the uppermost layer corresponding to the uppermost bank portion 13 and the upper surfaces C33 and C43 of the uppermost layer corresponding to the lowermost base 11.

FIG. 9 is a drawing associated with a fifth example of the invention. According to the fifth example, the conductive vias V1 and V2 vertically penetrating through the bottom portion 11 of the base 11 are not necessarily formed at positions in the middle of the pillow portion 10d illustrated with a solid line. As illustrated with an arrow in the drawing, unless the tolerance of strength is undermined, these conductive vias may be formed at any position between the position in the middle of the pillow portion 10d and a position illustrated with a dotted line at a lower part of the inner side surface of the pillow portion 10d. Similarly, the conductive vias V3 and V4 vertically penetrating through the bottom portion 11 of the base 1 are not necessarily formed at the position in the middle of the holding table 10c illustrated with a solid line. As illustrated with an arrow in the drawing, unless the tolerance of strength is undermined, these conductive vias may be formed at any position between t the position in the middle of the holding table 10c and a position illustrated with a dotted line at a lower part of the inner side surface of the holding table 10c.

The invention can be carried out in many other forms without departing from its technical concept or principal technical features. The examples described so far are just a few examples of the invention in all aspects, which should not be used to restrict the scope of the invention. The scope of the invention is solely defined by the appended claims, and should not be restricted by the text of this description.

Any modifications or changes made within the scope of equivalents of the appended claims are all included in the scope of the invention.

The invention is applicable to surface mounted piezoelectric vibrators.

The invention claimed is:

1. A piezoelectric vibrator, comprising:
a base with insulating properties, having a rectangular outer shape in plan view, the base including a plurality of ceramic substrate layers stacked in at least three layers and castellations extending in vertical directions and respectively formed at four corners of the rectangular shapes of the plurality of ceramic substrate layers, the base further including a housing portion having a plurality of internal terminal pads formed therein, and an exterior portion having at least four external terminals formed on an outer bottom surface thereof;
an integrated circuit element electrically connected to a part of the plurality of internal terminal pads; and
a piezoelectric vibration element electrically connected to another part of the plurality of internal terminal pads and further electrically connected to the integrated circuit element, wherein
the four external terminals are formed proximate to and in non-contact with the castellations formed at the four corners, and one of the four external terminals constitutes an external terminal for output of alternating current,
the part and the another part of the plurality of internal terminal pads are formed on respective surfaces of the ceramic substrate layers which are different layers (hereinafter, different layer surfaces),
externally exposed wiring patterns that provide connection between the part of the plurality of internal terminal pads and the another part of the plurality of internal terminal pads are formed on upper surfaces of first and second castellations alone, the first and second castellations being provided at one of pairs of corners among the four corners of the rectangular shape of the ceramic substrate layer constituting a middle layer between the ceramic substrate layers respectively constituting uppermost and lowermost layers of the ceramic substrate layers stacked in at least three layers,
the first castellation is a castellation located opposite to a third castellation in a long-side direction of the base, the third castellation being provided at one of the four corners of the rectangular shape proximate to the external terminal for output of alternating current, and
the second castellation is a castellation provided at one of the four corners diagonally opposite to the third castellation on the rectangular shape of the base in plan view.

2. The piezoelectric vibrator as claimed in claim 1, wherein the piezoelectric vibration element mounted in the housing portion of the base is hermetically sealed with a cover attached to a joint area on an upper surface of the ceramic substrate layer constituting the uppermost layer and formed as a rectangular frame surrounding a rectangular space centrally located,
the castellations of the ceramic substrate layer constituting the uppermost layer are formed at only four corners on an outer side of the rectangular frame of the ceramic substrate layer constituting the uppermost layer, and
a chamfer or a curvature is formed at each of four corners on an inner side of the rectangular frame of the ceramic substrate layer constituting the uppermost layer.

3. The piezoelectric vibrator as claimed in claim 1, wherein
the integrated circuit element has a rectangular shape and includes pads formed on a main surface thereof, the pads being flip-chip bonded to the part of the plurality of internal terminal pads by means of bumps,
the pads of the integrated circuit element include:
two opposing first pads formed proximate to a first side of the integrated circuit element;
two opposing second pads formed proximate to a second side opposite to the first side of the integrated circuit element; and
two opposing third pads respectively formed between the first pads and the second pads, one of the two opposing second pads outputting alternating current,
the plurality of internal terminal pads of the base include:
two opposing first internal terminal pads electrically connected to the piezoelectric vibration element and joined to the two opposing first pads of the integrated circuit element;
two opposing second internal terminal pads joined to the two opposing second pads; and
two opposing third internal terminal pads joined to the two opposing third pads and interposed between the two opposing first internal terminal pads and the two opposing second internal terminal pads,
the two opposing third internal terminal pads and two wiring patterns that respectively extend the two opposing third internal terminal pads are formed on the same surface along a part of perimeter of the two opposing first internal terminal pads to respectively form conducive paths for blocking radiation noise, and
the two opposing first internal terminal pads and the two opposing second internal terminal pads are spaced apart with the conducive paths for blocking radiation noise interposed therebetween.

4. The piezoelectric vibrator as claimed in claim 1, wherein the piezoelectric vibration element is an AT-cut crystal piece.

5. The piezoelectric vibrator as claimed in claim 1, wherein
the base includes a bottom portion constituting a lowermost layer, a first bank portion constituting a middle layer, and a second bank portion constituting an uppermost layer, the bottom portion constituting the lowermost layer is constructed of a single plate made of a ceramic material and having a rectangular shape in plan view, the first bank portion constituting the middle layer is made of a ceramic material and formed in a frame shape in plan view on the bottom portion constituting the lowermost layer, the second bank portion constituting the uppermost layer is made of a ceramic material and formed in a frame shape in plan view on the first bank portion constituting the middle layer,
the housing portion of the base corresponding to the lowermost layer includes:
a first housing portion formed by the first bank portion constituting the middle layer to house therein the integrated circuit element; and
a second housing portion formed by the second bank portion constituting the uppermost layer to house therein the piezoelectric vibration element, and
the plurality of internal terminal pads are formed on an inner bottom surface of the first housing portion.

6. The piezoelectric vibrator as claimed in claim 1, wherein the base includes an intermediate plate portion constituting a middle layer, a third bank portion constituting an upper layer, and a fourth bank portion constituting a lower layer, the intermediate plate portion constituting the middle layer is constructed of a single plate made of a ceramic material and having a rectangular shape in plan view, the third bank portion constituting the upper layer is made of a ceramic material and formed on the intermediate plate portion constituting the middle layer, the fourth bank portion constituting the lower layer is made of a ceramic material and formed in a frame shape in plan view below the intermediate plate portion constituting the middle layer, the housing portion of the base includes:

a third housing portion formed by the third bank portion constituting the upper layer to house therein the piezoelectric vibration element; and a fourth housing portion formed by the fourth bank portion constituting the lower layer to house therein the integrated circuit element, and the first to third internal terminal pads are formed on an inner bottom surface of the fourth housing portion.

7. The piezoelectric vibrator as claimed in claim 3, further comprising:

two first wiring patterns that respectively extend the two opposing first internal terminal pads to first and second castellations of the four castellations provided at the four corners of the rectangular shape of the base;

two second wiring patterns that respectively extend the two opposing second internal terminal pads to remaining two castellations of the four castellations located opposite to the first and second castellations; and two wiring patterns for noise blocking extending in a short-side direction of the base from the two wiring patterns that respectively extend the two opposing third internal terminal pads to an end part of an inner bottom surface of the base.

8. The piezoelectric vibrator as claimed in claim 1, wherein the castellations of the ceramic substrate layer constituting the middle layer are recessed more inward than at least one of the castellations of the ceramic substrate layers respectively constituting the uppermost layer and the lowermost layer.

* * * * *